(12) United States Patent
Horvath

(10) Patent No.: US 6,204,706 B1
(45) Date of Patent: *Mar. 20, 2001

(54) VOLTAGE SUPERVISORY CIRCUIT FOR A MULTI-RAIL POWER SUPPLY

(75) Inventor: Stephen Ejner Horvath, Roseville, CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/104,485

(22) Filed: Jun. 24, 1998

(51) Int. Cl.[7] .............................. H02H 3/24; H03K 17/22
(52) U.S. Cl. .............................. 327/198; 327/143; 361/92
(58) Field of Search ................................ 327/58, 72, 82, 327/77, 78, 97, 143, 198; 361/92

(56) References Cited

U.S. PATENT DOCUMENTS

| 4,451,859 | * | 5/1984 | Noel | 360/75 |
|---|---|---|---|---|
| 4,951,171 | * | 8/1990 | Tran et al. | 361/90 |
| 5,111,065 | * | 5/1992 | Roberge | 327/109 |
| 5,214,316 | * | 5/1993 | Nagai | 327/143 |
| 5,224,010 | * | 6/1993 | Tran et al. | 361/90 |
| 5,313,112 | * | 5/1994 | Macks | 327/143 |
| 5,446,404 | * | 8/1995 | Badyal et al. | 327/143 |
| 5,774,649 | * | 6/1998 | Goh | 323/303 |
| 5,917,255 | * | 6/1999 | Ciccone | 327/143 |

\* cited by examiner

*Primary Examiner*—Timothy P. Callahan
*Assistant Examiner*—Terry L. Englund

(57) ABSTRACT

An apparatus for supervising input voltages of a multi-rail power supply includes a corresponding voltage detector unit electrically connected to each rail for ascertaining values of the input voltages of each rail. An output of each voltage detector unit is electrically connected at a wired-or node. A pull-up resistor is connected between the wired-or node and a power supply for pulling the voltage level of the wired-or node high. Circuitry generates a power-good signal responsive to the voltage of the wired-or node being greater than a predetermined threshold voltage.

17 Claims, 3 Drawing Sheets

VOLTAGE SUPERVISORY CIRCUIT FOR A MULTI-RAIL POWER SUPPLY

BACKGROUND

The present invention relates generally to a voltage supervisory circuit for monitoring input voltage levels. More particularly, the present invention relates to a circuit for supervising at least one input voltage of a multi-rail power supply, and generating a power-good signal responsive to all supervised input voltages being greater than a predetermined threshold voltage.

Developers of products which are voltage sensitive, such as computers, can face many problems. One problem is that certain computer components require a minimum threshold voltage to achieve predictable performance. For example, a voltage supply could corrupt nonvolatile memory due to the supply voltage being low relative to the minimum threshold voltage, as may occur during power-up and during a brown out. Additionally, a central processing unit could behave erratically and furnish erroneous responses during a fluctuating situation voltage such as a power dropout. Thus, it is important for developers of such products to know when power is considered good, i.e., above a certain threshold voltage (a "power-good" situation).

While monitoring a power-good situation when there is only one supply voltage is difficult, the difficulty increases when the product being powered requires multiple voltage levels from a single power supply or from various individual power supplies, such as many modem products require today. In addition to a traditional 5V power supply, new products are beginning to utilize 3.3V, 2.5V, and 1.9V supplies. Previous solutions to address power-up and under voltage problems have been inadequate. Some developers have ignored the problem entirely and have implemented no protection, thereby exposing themselves to the erratic behavior described above. Other developers have utilized circuitry that detects low voltage conditions only on a primary power supply rail. This solution is inadequate because it ignores the other power supply rail voltages. (While the application refers to supply rails and rail voltages, it is contemplated that power buses may also be utilized). Similarly, while some developers have implemented circuitry that monitors all the power supply rails, additional problems exist.

One problem developers face is the lack of availability of a single circuit that functions to provide multiple rail voltage detection. The few monolithic integrated circuit (IC) devices in existence which are capable of detecting multiple voltages are expensive. Further, generally the ICs that exist do not support all possible invalid power scenarios. They either support under voltage, reset, or dropout detection, but typically not all three. In this regard, under voltage occurs when the power shifts from good, i.e., above the minimum threshold voltage, to bad, which is below the minimum threshold voltage. Such a situation transpires, for example, during a brown out, or when the power is turned off and lingering voltage on the rail exists due to inherent capacitance on the rail. Reset ensues when voltage levels proceed from bad to good such as during power-up. Dropout occurs when voltage levels move from good to bad to good, all within a short time frame of about 10–20 ms.

Other problems include the fact that existing ICs do not allow for a time delay, preferably at least about 200 ms, of acceptable power levels, and if they do, the period of delay cannot be changed from the original arbitrary setting established by the manufacturer. Likewise, the manufacturer typically sets the threshold voltage which cannot be changed. Moreover, while some solutions properly apply a delay to the power-good signal when power first comes up, they fail to properly delay the signal during the quick dropout cycle. Similarly, current known ICs fail to deactivate the time delay immediately upon dropout.

Accordingly, in response to the problems discussed above, a primary object of the present invention is to provide an improved apparatus for supervising an input voltage of a multi-rail power supply and generating a power-good signal responsive to all supervised input voltages being greater than their respective predetermined threshold voltages.

Another object of the present invention is to provide a relatively inexpensive, single improved apparatus that functions to allow multiple rail voltage detection.

A further object of the present invention is provide such an improved voltage detection apparatus that supports all possible invalid power scenarios.

An additional object of the present invention is to provide an improved apparatus that allows for an adjustable time delay and threshold voltage.

Yet another object of the present invention is to provide such an improved apparatus which cancels the power-good signal immediately when the supply voltage falls below the threshold voltage, and to incorporate the proper delay before re-establishing the power-good signal after the supply voltages achieve the threshold voltage.

These and other objects of the present invention will be apparent from the following detailed description of the invention, while referring to the attached drawings in which.

DETAILED DESCRIPTION OF THE PREFERRED EMBODIMENTS

Broadly stated, the present invention provides circuitry for supervising input voltages of a multi-rail power supply, and includes voltage detectors electrically connected to input voltages to indicate when the power on all of the rails is "good", i.e., within a predetermined range.

More specifically, the present invention is an improved apparatus for monitoring separate power supply rails, each with its own voltage, to ensure that each supply voltage meets or exceeds a certain threshold. A voltage detector unit is electrically connected to each rail for ascertaining values of the input voltages of each rail. Connected to an output of the voltage detector units is a wired-or node. A pull-up resistor is connected between the power supply and the wired-or node for pulling the voltage level of the wired-or node high. Circuitry generates a power-good signal responsive to the voltage of the wired-or node being greater than a predetermined threshold voltage.

Figure 1:
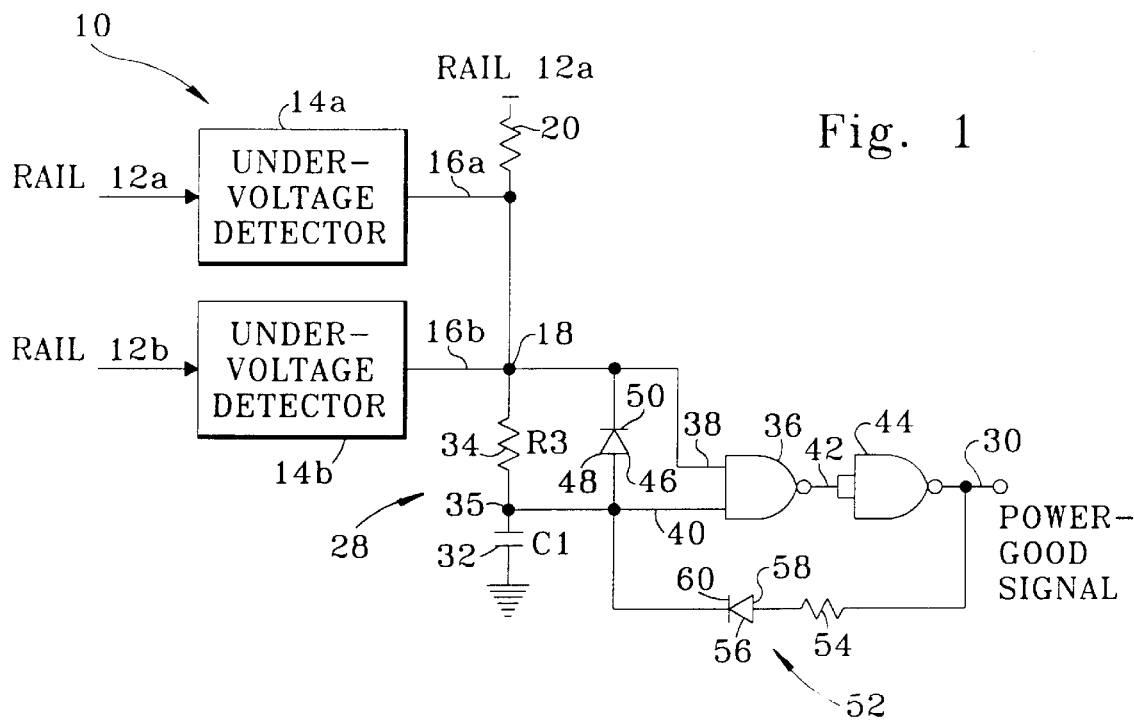
FIG. 1 is a detailed electrical schematic diagram of the circuitry of the present invention.

Referring now to the drawings, the preferred embodiment of the present voltage supervisory circuit is shown in FIGS. 1–6, with FIG. 1 showing the preferred embodiment of the present voltage supervisory circuit, designated generally at 10, in a fully assembled state. To better understand the voltage supervisory circuit 10, an embodiment of the invention can be broken down into multiple parts shown in FIGS. 2–6, each of which has its own unique contribution to the total circuit. Therefore, each section will be discussed separately, followed by a discussion of how the constituents are integrated into the whole.

Figure 2:
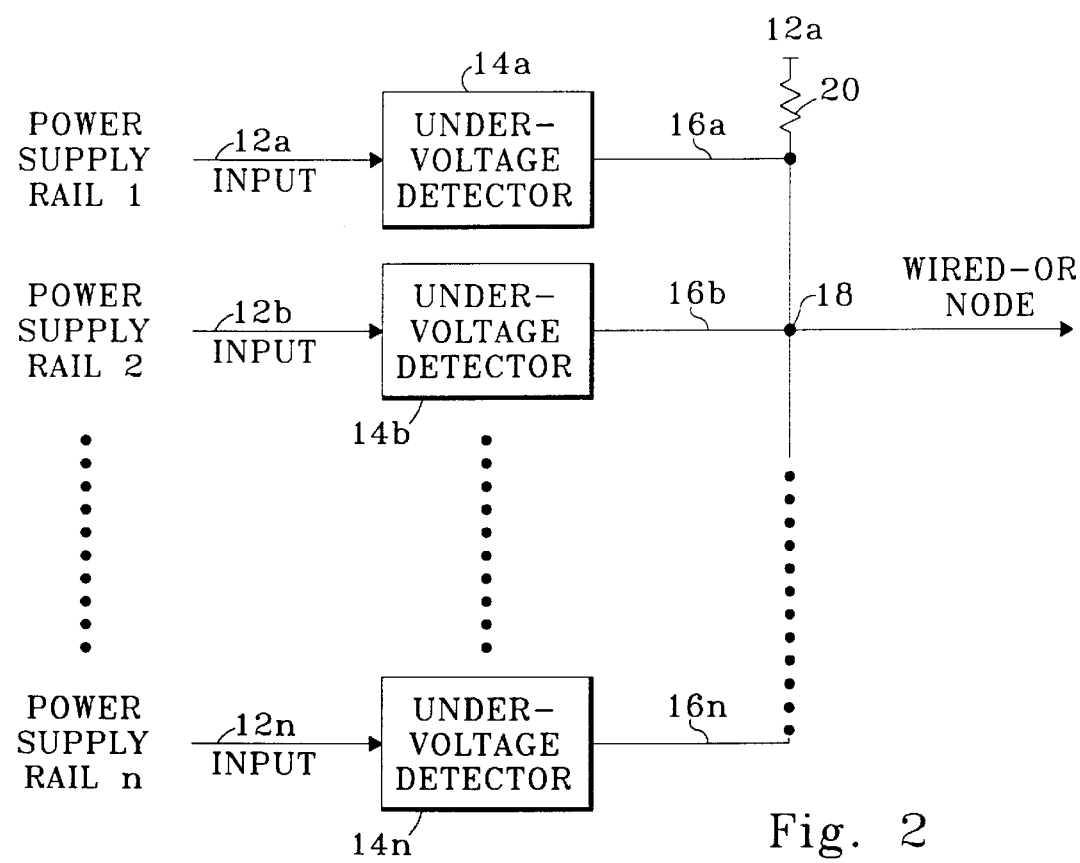
FIG. 2 is an isolated block diagram of the under voltage detectors connected to the rail voltages of the present invention.

Referring now to FIG. 2, each power supply rail 12a, 12b, 12n is connected to a corresponding under voltage detector unit 14a, 14b, 14n. The under voltage detectors 14 can be a low cost, off the shelf, integrated circuit, such as Motorola MC34064 or Motorola MC33464 integrated circuits. Outputs 16a, 16b, 16n of the voltage detector units 14 are connected at a common node hereinafter referred to as a wired-or node 18. The detectors 14 function based upon a certain threshold voltage preset.

When the voltage on any rail 12 is below the threshold voltage of its associated detector 14, the detector 14 will switch its output 16 to ground, thus pulling the voltage at the wired-or node 18 to ground. Conversely, when a voltage of any one power supply rail 12 exceeds the threshold voltage of the detector 14, the detector 14 is an open circuit. When the voltages on all the power supply rails 12 exceed the threshold voltage, all detectors 14 are an open circuit, and a pull-up resistor 20 will pull the wired-or node high. The pull-up resistor 20 is connected in parallel to any one of the power supply rails 12, but it is preferred that the pull-up resistor 20 be tied to the rail 12 containing the highest voltage or that which is considered the most reliable. Hence, the wired-or circuitry insures that all of the input voltages 12 meet or exceed the required threshold voltage before the pull-up resistor 20 pulls the voltage at the wired-or node 18 high.

Figure 3:
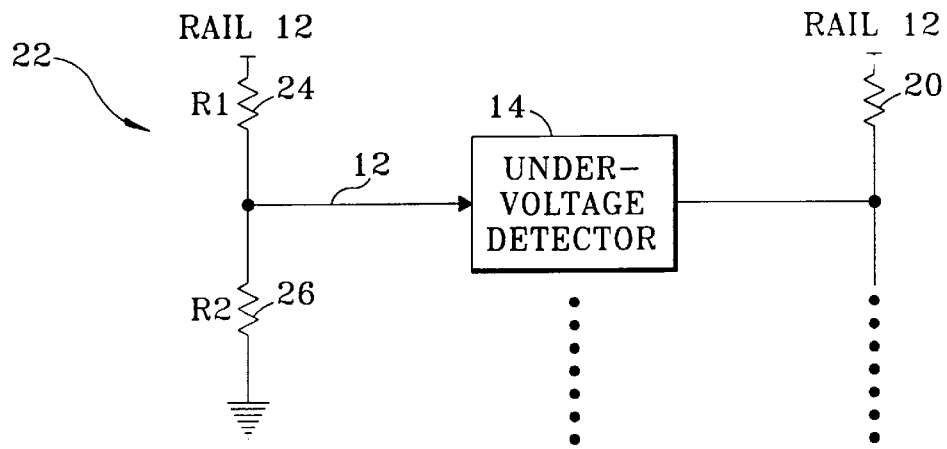
FIG. 3 is an isolated electrical schematic of the adjustable threshold voltage of the present invention.

Now referring to FIG. 3, each voltage detector unit 14 can have a desired threshold of the input voltage 12 set by a simple voltage divider circuit, indicated generally as 22. This divider 22 will work as long as the desired threshold voltage is greater than the manufacturer preset threshold of the voltage detector 14. One can utilize a first divider resistor 24 (referred to below in the formula as R1) and a second divider resistor 26 (referred to below in the formula as R2) to adjust the preset threshold of the detector 14. The first resistor 24 is connected between the rail 12 and both the second resistor 26 and the voltage detector 14, and the second resistor 26 is also connected to ground. The desired threshold voltage is determined according to the following formula:

$$\text{Desired threshold voltage} = (\text{preset threshold voltage}) * (R1+R2)/(R2).$$

Figure 4:
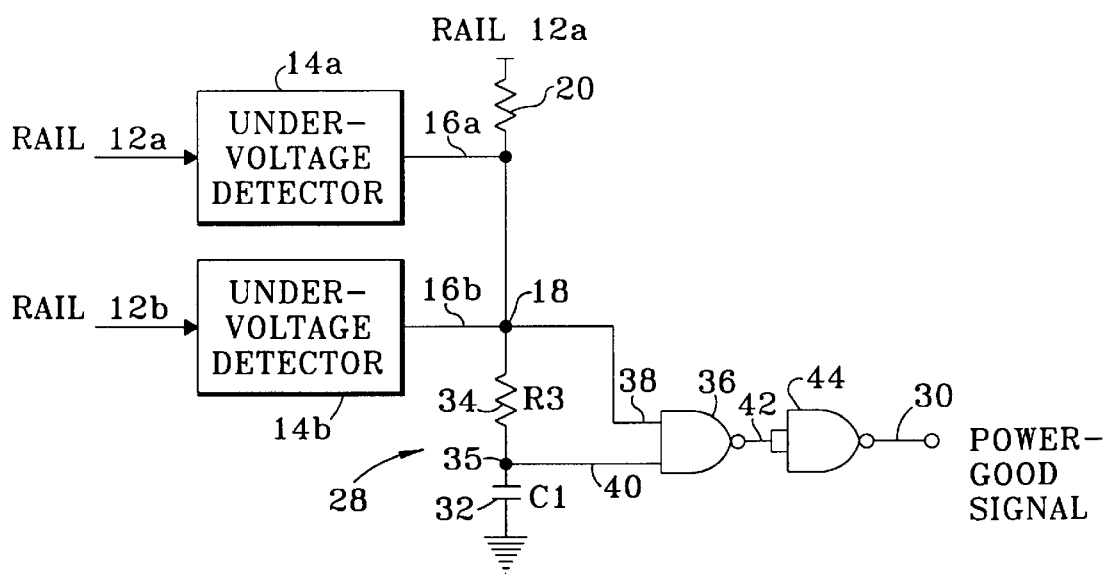
FIG. 4 is an electrical schematic including the reset delay timer and immediate under voltage detection of the present invention.

Referring now to FIG. 4, a delay timer circuit, generally designated as 28 is shown. When power is first applied to the product being powered, the voltages on rails 12 may come up in an unpredictable manner. Such transient conditions during power up require time to settle down. Therefore, to prevent any late erroneous glitches from disrupting the product, the voltage supervisory circuit 10 does not generate a power-good signal on output line 30 immediately after all the voltages on the power rails are greater than their respective thresholds. Once the voltages on all monitored power supply rails 12 exceed the threshold value for each rail 12, the timer circuit 28 begins. After the proper time has elapsed, if all of the voltages are still greater than their threshold, the voltage supervisory 10 will assert the power-good signal on line 30.

The delay is achieved by adding in series a delay circuit capacitor 32 (referred to below in the formula as C1) and a delay circuit resistor 34 (referred to below in the formula as R3) to the wired-or node 18 of the supervisory circuit 10. The delay resistor 34 is connected to the wired-or node 18 and to the delay capacitor 32 by time delay node 35, and the delay capacitor 32 is also connected to ground. By adjusting the value of the capacitor 32 and the resistor 34, one can set the delay after power up to virtually any time duration desired. While the formula for the time delay is approximate and depends on the supply voltage and family of logic selected, the formula for the particular embodiment depicted is roughly:

$$\text{Time delay} = 0.38 * R3 * C1.$$

Where time delay is in seconds.
Where $R_3$ is in ohms.
Where $C_1$ is in farads.
Where 0.38 is a constant in sec/ohms/F.

The circuitry for enabling the supervisory circuit 10 to immediately detect a power-bad situation from any of the rails 12 is also shown in FIG. 4. Importantly, while the voltage supervisory circuit 10 provides a delay upon power up before asserting the power-good or high signal on line 30, the circuit 10 does not delay in canceling the power-good signal on line 30 during a power-bad condition. To achieve this result, the voltage supervisory circuit 10 utilizes a NAND gate 36 in a unique fashion. The wired-or node 18 is connected directly to a first input 38 of the NAND gate 36, and its second input 40 is connected to the time delay node 35. An output 42 of the NAND gate 36 is connected to the input of an inverter 44 which produces the power-good signal on output line 30. While, the present invention utilizes generic 74HC00 NAND gates for the gates 36 and 44 other families of gates are contemplated. The HC family is preferred, however, because it functions with power supply rail voltages down to 2 volts.

As is well known, NAND gates having two inputs require both inputs to be high for the output to be low. Thus, in the present invention, during power up both a delayed signal at the time delay node 35, and nondelayed signal at the wired-or node 18, must be high for the output of the NAND gate 36 to be low. When the output of the NAND gate 36 is low, the output of inverter 44 will be high. Conversely, if either the delayed or nondelayed signals are low, line 30 will be low. Therefore, when the voltage on the wired-or node 18 goes low, line 30 will go immediately low.

Figure 5:
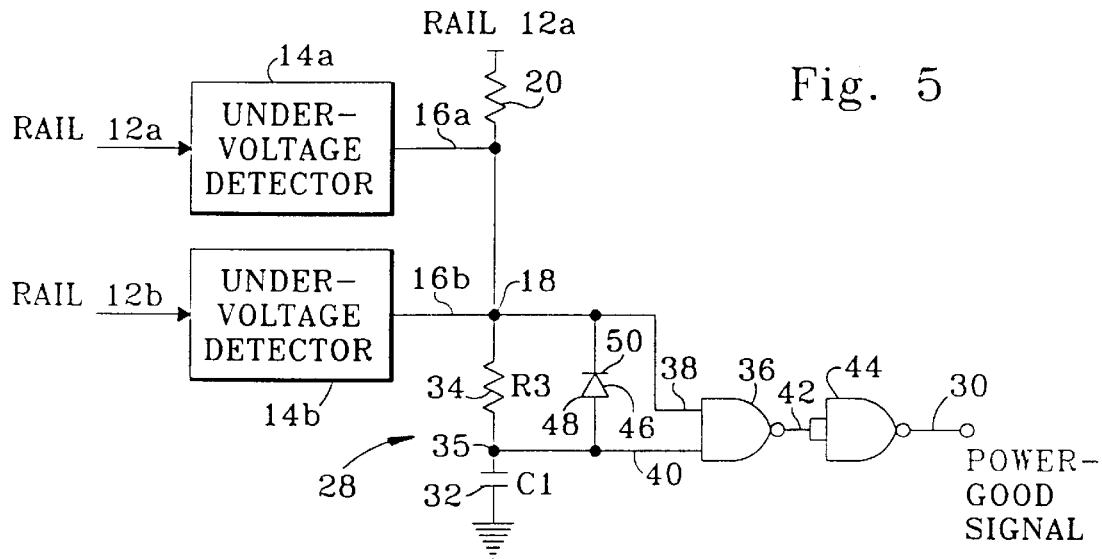
FIG. 5 is the electrical schematic of FIG. 4 with the addition of a dropout recovery element.

Referring now to FIG. 5, the voltage supervisory circuit 10 includes diode 46 for dropout recovery. The circuit utilizes the diode 46 to rapidly discharge the delay timer circuit 28 during dropout, i.e., when the input voltage falls below the threshold voltage for a shorter period of time than would otherwise be required to discharge the delay circuit 28. The diode can be, for example, an industry generic BAV99. The diode 46 has an anode end 48 and a cathode end 50. To discharge the delay circuit 28, the anode end 48 is connected to the second input 40 of the NAND gate 36, and the cathode end 50 is connected to the wired-or node 18.

When power is ramping up, the diode is reverse biased and has no effect on a time constant of the delay timer circuit 28. If one of the voltage detectors 14 sense an under voltage situation, however, the detector 14 will bring the wired-or node 18 to ground, thus the diode 46 will become forward biased and will discharge the capacitor 32 immediately. Therefore, if power does recover after a short interval, as it does, for example, during dropout, the capacitor will start out fully discharged and the proper delay will occur before the supervisory circuit 10 asserts the power-good signal on line 30.

Figure 6:
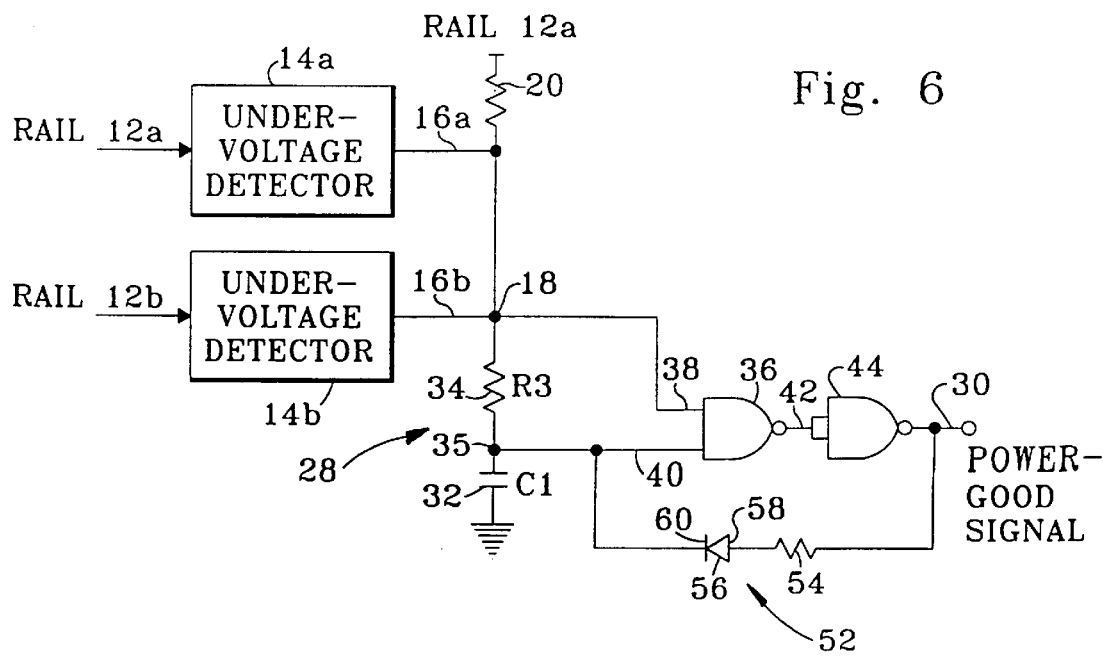
FIG. 6 is an electrical schematic including the positive feedback of the power-good signal to the delay circuit of the present invention.

Referring now to FIG. 6, the voltage supervisory circuit 10 includes feedback circuitry, generally designated 52, for feeding back the power-good signal on line 30 to the delay timer circuit 28 to combat the effect of noise on the power-good signal. When power comes up, it is possible that the voltage may pass over the threshold several times in a very short period. This could cause the power-good signal to switch back and forth from good to bad erratically. Further, because the voltage on the reset timing capacitor may ramp slowly, any small amount of noise in the circuit could also cause a glitch or oscillation to the power-good signal. To prevent such glitches, the circuit 10 includes the feedback circuitry 52 added in parallel to the gates 36 and 44.

The feedback circuitry 52 includes, in series, a feedback resistor 54 and a feedback diode 56, the diode 56 having an anode end 58 and a cathode end 60. The feedback resistor 54 is connected to line 30 and to the anode end 58 of the feedback diode 56. The cathode end 60 of the feedback diode 56 is connected to both the second input 40 of the NAND gate 36 and the delay circuit capacitor 32. Once the second input 40 of the NAND gate 36 is driven high, the power-good signal on line 30 is driven high almost immediately. Thus, the high level power-good signal on line 30 forward biases the feedback diode 56 and causes the voltage on the capacitor to ramp quickly. The quick ramp reduces the chance that noise can cause glitches or oscillations on the second input 40 of the NAND gate 36.

Returning to FIG. 1, the complete voltage supervisory circuit 10 is shown. The circuit, which is a hybrid of analog and digital components, reduces the number of gates and transistors that would otherwise be necessary to perform the same functions. The circuit 10 is able to supervise multi-rail voltages to insure that the voltages exceed a certain threshold. The circuit 10 allows for an adjustable time delay and threshold voltage. Further, the circuit 10 can immediately detect an under voltage and allows for the proper delay before re-establishing the power good signal.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. Apparatus for supervising at least two input voltages supplied thereto, said apparatus comprising:
    voltage detector means corresponding to each of the at least two input voltages for receiving the at least two input voltages and ascertaining corresponding values of the at least two input voltages;
    a wired-or node electrically connected to outputs of said corresponding voltage detector means;
    pull-up means adapted to be electrically connected to a power supply and connected to said wired-or node for pulling a voltage level of said wired-or node high when each of said corresponding values of the at least two input voltages exceeds a predetermined threshold voltage of said corresponding voltage detector means;
    means for generating a power-good signal responsive to said voltage level of said wired-or node being high; and
    a delay circuit including a resistor and a capacitor connected in series between said wired-or node and ground, respectively, for delaying generation of said power-good signal for a predetermined time.

2. The apparatus as defined in claim 1 wherein said outputs of said corresponding voltage detector means vary as a function of said corresponding values of the at least two input voltages relative to said predetermined threshold voltages of said corresponding voltage detector means.

3. The apparatus as defined in claim 2 further comprising means connected to each said corresponding voltage detector means for adjusting said predetermined threshold voltage of said corresponding voltage detector means.

4. The apparatus as defined in claim 2 wherein said corresponding voltage detector means are provided on an integrated circuit.

5. The apparatus as defined in claim 2 wherein said pull-up means comprises a pull-up resistor electrically connected at one end to said wired-or node and adapted to be connected to said power supply at the other end.

6. The apparatus as defined in claim 1 wherein said delay circuit does not delay disabling said power-good signal if any of said corresponding values of the at least two input voltages falls below said predetermined threshold voltage of said corresponding voltage detector means.

7. The apparatus as defined in claim 1 wherein said power-good signal generating means includes aNAND gate and an inverter said NAND gate having a first input electrically connected to said wired or node a second input connected to said delay circuit, and an output connected to an input of said inverter, and said inverter outputs said power-good signal.

8. The apparatus as defined in claim 1 further comprising discharge means for rapidly discharging said delay circuit if any of said corresponding values of the at least two input voltages falls below said predetermined threshold voltage of said corresponding voltage detector means for a shorter period of time than would otherwise be required to discharge said delay circuit.

9. The apparatus as defined in claim 8 wherein said discharge means comprises a diode with an anode end and a cathode end, said anode end being electrically connected to a node between said resistor and said capacitor of said delay circuit, and said cathode end being electrically connected to said wired-or node.

10. The apparatus as defined in claim 1 wherein said power-good signal generating means comprises feedback means for feeding back said power-good signal to said delay circuit to combat the effect of noise on said power-good signal.

11. The apparatus as defined in claim 10 wherein said feedback means comprises a resistor and a diode with an anode end and a cathode end, said resistor of said feedback means being electrically connected between an output line of said power-good signal generating means and said anode end of said diode of said feedback means, and said cathode end of said diode being electrically connected to both an input of said power-good signal generating means and said capacitor of said delay circuit.

12. The apparatus as defined in claim 3 wherein said adjusting means is a voltage divider circuit.

13. Apparatus for generating a power-good signal from at least two input voltages supplied to said apparatus, said apparatus comprising:
    voltage detector means corresponding to each of the at least two input for receiving the at least two input voltages and ascertaining whether each of the at least two input voltages exceeds a predetermined threshold voltage of said corresponding voltage detector means;

a wired-or node electrically connected to outputs of said corresponding voltage detector means for holding a signal for producing the power-good signal when said corresponding voltage detector means indicate that each of the at least two input voltages has exceeded said predetermined threshold voltage of said corresponding voltage detector means;

a delay circuit including a resistor and a capacitor connected in series between said wired-or node and ground, respectively, for delaying generation of the power-good signal for a predetermined time after said wired-or node holds said signal for producing the power-good signal; and discharge means electrically connected to said delay circuit and said wired-or node for rapidly discharging said delay circuit when any of the at least two input voltages falls below said predetermined threshold voltage of said corresponding voltage detector means for a shorter period of time than would otherwise be required to discharge said delay circuit.

14. The apparatus as defined in claim 13 further comprising means for generating a power-good signal responsive to said signal for producing the power-good signal held on said wired-or node.

15. The apparatus as defined in claim 13 wherein said delay circuit avoids delaying disabling of the power-good signal if any of the at least two input voltages falls below said predetermined threshold voltage of said corresponding voltage detector means.

16. The apparatus as defined in claim 15 wherein said discharge means comprises a diode with an anode end and a cathode end, said anode end being electrically connected to a node between said resistor and said capacitor of said delay circuit, and said cathode end being electrically connected to said wired-or node.

17. The apparatus as defined in claim 14 wherein said power-good signal generating means includes a NAND gate and an inverter, said NAND gate having a first input electrically connected to said wired-or node, a second input connected to said delay circuit, and an output connected to an input of said inverter, and said inverter outputs said power-good signal.

\* \* \* \* \*